(12) United States Patent
Shin

(10) Patent No.: US 7,015,589 B2
(45) Date of Patent: Mar. 21, 2006

(54) SEMICONDUCTOR DEVICE HAVING LOW-K DIELECTRIC FILM IN PAD REGION

(75) Inventor: Hong-Jae Shin, Yongin (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/806,341

(22) Filed: Mar. 23, 2004

(65) Prior Publication Data
US 2004/0222530 A1 Nov. 11, 2004

(30) Foreign Application Priority Data
Mar. 27, 2003 (JP) .............................. 2003-087805

(51) Int. Cl.
H01L 29/40 (2006.01)
H01L 23/48 (2006.01)
H01L 23/52 (2006.01)

(52) U.S. Cl. .................... 257/780; 257/750; 257/758; 257/784

(58) Field of Classification Search ................ 257/750, 257/758, 774, 780, 781, 784
See application file for complete search history.

(56) References Cited

U.S. PATENT DOCUMENTS

| 6,037,668 | A | * | 3/2000 | Cave et al. ................ 257/784 |
| 6,124,198 | A | * | 9/2000 | Moslehi ..................... 438/622 |
| 6,362,531 | B1 | * | 3/2002 | Stamper et al. ............ 257/781 |
| 6,372,661 | B1 | * | 4/2002 | Lin et al. ................... 438/769 |
| 6,518,166 | B1 |   | 2/2003 | Chen et al. |
| 2003/0020163 | A1 | * | 1/2003 | Hung et al. ................ 257/734 |
| 2003/0074789 | A1 | * | 4/2003 | Chen et al. .................. 29/843 |
| 2003/0155642 | A1 | * | 8/2003 | Davis et al. ............... 257/700 |

* cited by examiner

Primary Examiner—Jasmine Clark
(74) Attorney, Agent, or Firm—Marger Johnson & McCollom, P.C.

(57) ABSTRACT

A low-k dielectric film is formed on an entire surface of a substrate having a pad region and a circuit region. A resist pattern is formed on the low-k dielectric film, and an opening is formed in the low-k dielectric film of the pad region using the resist pattern as a mask. A silicon oxide film having strength higher than the low-k dielectric film is formed in the opening by liquid-phase deposition. Wirings are formed in the silicon oxide film of the pad region and in the low-k dielectric film of the circuit region using the damascene method.

7 Claims, 3 Drawing Sheets

A  B

US 7,015,589 B2

SEMICONDUCTOR DEVICE HAVING LOW-K DIELECTRIC FILM IN PAD REGION

FIELD OF THE INVENTION

The present invention relates to a semiconductor device, and a method for the manufacture thereof, and specifically to a semiconductor device having improved resistance to impact to pad region, and a method for the manufacture thereof.

DESCRIPTION OF THE BACKGROUND ART

In recent years, accompanying the miniaturization of wiring in semiconductor integrated circuits, signal delay problems can occur. To solve these problems, there has been proposed a method for lowering the wiring resistance using copper as wiring material, and a method for lowering capacitance using a low-dielectric-constant film (low-k dielectric film) as an interlayer insulating film.

FIG. 4 is a schematic sectional view for illustrating a semiconductor device according to background art.

In order to solve the problems of the above-described signal delay, in a semiconductor device having a pad region A and a circuit region (device region) B, as FIG. 4 shows, low-k dielectric film is applied to the entire surface of a substrate as interlayer insulating films 11, 21, 31 and 41.

When the above-described semiconductor device having low-k dielectric film applied to the entire surface of a substrate is packaged, physical impact is exerted to the low-k dielectric films 11, 21, 31 and 41 formed in the pad region A.

However, since physical properties, such as strength, possessed by the low-k dielectric film is ⅒ (one-tenth) or less of physical properties possessed by a silicon oxide film (SiO₂ film), there has been a problem of a small margin to the impact exerted during packaging.

SUMMARY OF THE INVENTION

The present invention has been conceived to solve the previously-mentioned problems and a general object of the present invention is to provide a novel and useful semiconductor device and is to provide a novel and useful method for manufacturing a semiconductor device.

A more specific object of the present invention is to provide a semiconductor device having a high resistance to impact that occurs during packaging, and a method for manufacturing such a semiconductor device.

According to one aspect of the present invention, semiconductor device having a pad region and a circuit region comprises a low-k dielectric film formed on a pad region and a circuit region a substrate, the low-k dielectric film having dielectric constant of 3 or less. An insulating film is formed in the low-k dielectric film of the pad region, the insulating film having higher strength than the low-k dielectric film. Multi-layer wirings are formed in the insulating film of the pad region and in the low-k dielectric film of the circuit region. A bonding pad is formed on a highest wiring of the multi-layer wirings of the pad region.

According to another aspect of the present invention, in the method for manufacturing a semiconductor device having a pad region and a circuit region, a low-k dielectric film is first formed on an entire surface of a substrate. An opening is formed in the low-k dielectric film of the pad region. A first insulating film having higher strength than the low-k dielectric film is formed in the opening. Wirings in the first insulating film of the pad region and in the low-k dielectric film of the circuit region using a damascene process.

Other objects and further features of the present invention will be apparent from the following detailed description when read in conjunction with the accompanying drawings.

DETAILED DESCRIPTION OF THE PREFERRED EMBODIMENTS

Figure 1:
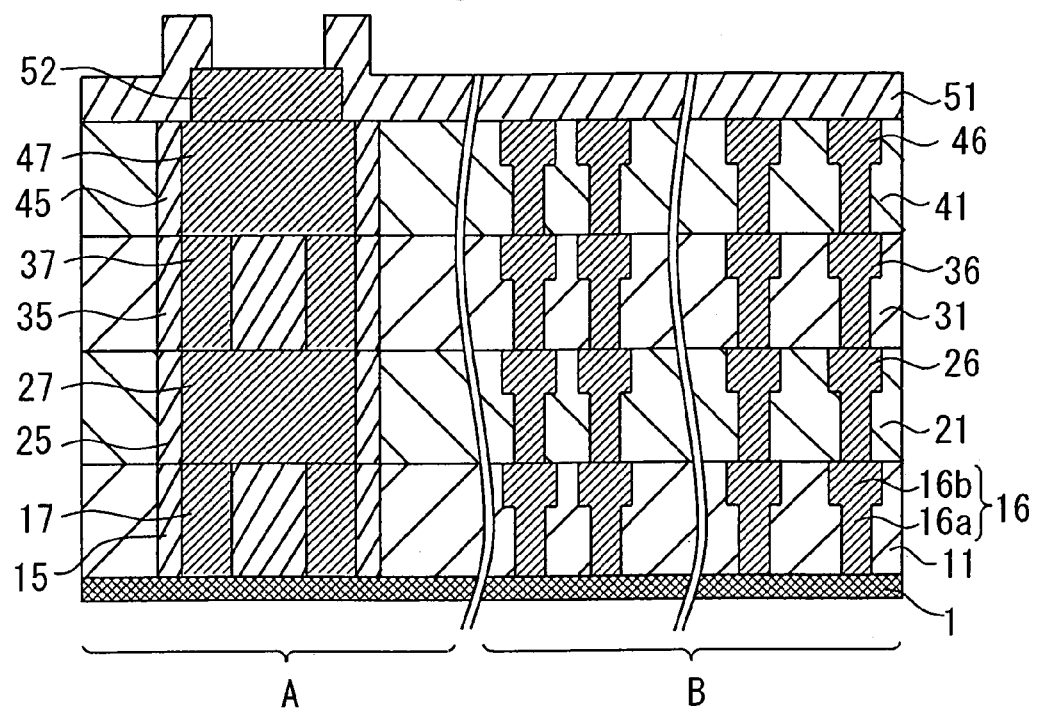
FIG. 1 is a schematic sectional view for illustrating a semiconductor device according to an embodiment of the present invention.

In the following, principles and embodiments of the present invention will be described with reference to the accompanying drawings. The members and steps that are common to some of the drawings are given the same reference numerals and redundant descriptions therefore may be omitted.

First, a semiconductor device according to an embodiment of the present invention will be described.

FIG. 1 is a schematic sectional view for illustrating a semiconductor device according to an embodiment of the present invention.

Figure 2:
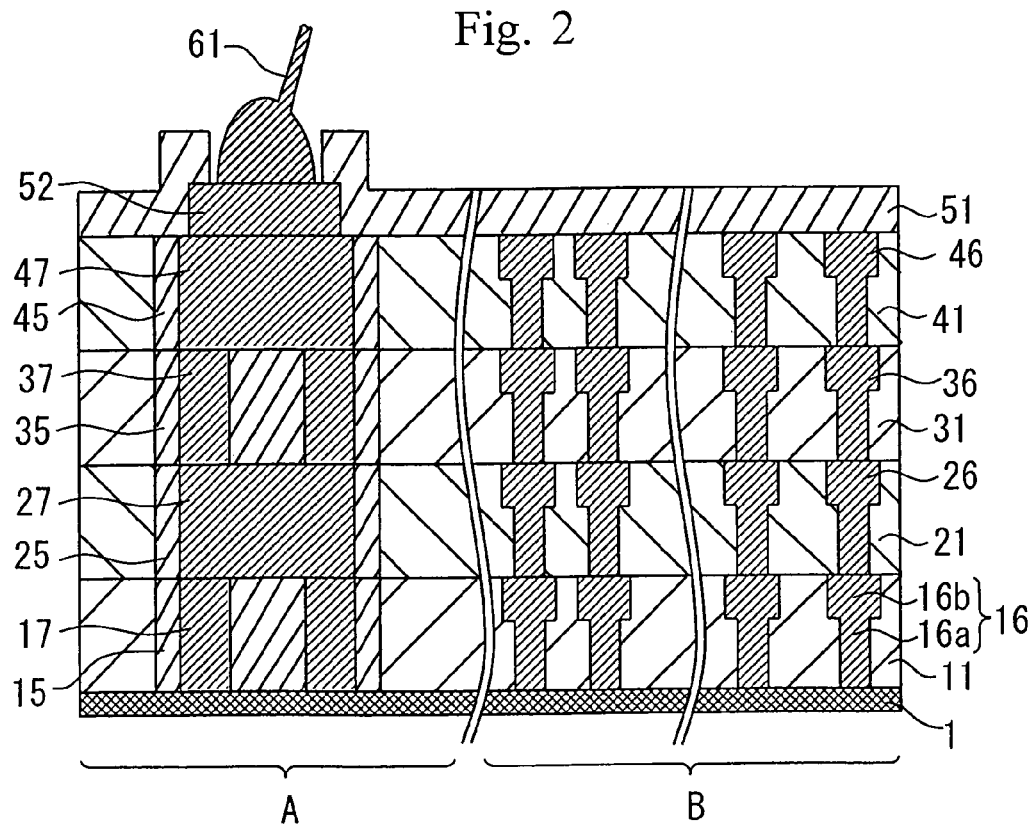
FIG. 2 is a schematic sectional view for illustrating a semiconductor device during packaging in an embodiment of the present invention.

As FIG. 1 shows, the semiconductor device according to this embodiment has a pad region A, a circuit region (device region) B and a plurality of wiring layers in the pad region A and circuit region B. As FIG. 2 shows, when the semiconductor device is packaged, such as a wire bonding, strong impact is exerted to the pad region A. In the circuit region B, various semiconductor elements, such as transistors and capacitors, are formed (not shown).

Although the semiconductor device of this embodiment has a plurality of wiring layers, since the wiring layers are substantially identical, the first (lowermost) wiring layer will be described below.

A low-k dielectric film 11 is formed on the substrate 1 of the pad region A and the circuit region B, that is, on the entire surface of the substrate 1. The low-k dielectric film 11 is an inorganic or organic interlayer insulating film having a dielectric constant (k) of 3 or less. The low-k dielectric film 11 is, for example, an insulating film containing silicon, carbon, oxygen and hydrogen, or a polymer (hydrogen-carbon polymer) film containing hydrogen and carbon.

In the low-k dielectric film 11 in the pad region A, an insulating film 15 having higher strength (higher physical property) than the low-k dielectric film 11 is formed. As the insulating film 15, a silicon oxide film is preferable. Other than a silicon oxide film, a BPSG, PSG or TEOS film can be used as the insulating film 15.

In the insulating film 15 formed in the pad region A, pad vias 17 are formed as wiring. Specifically, in the pad region A, the sidewalls of the pad vias 17 are surrounded by the silicon oxide film 15.

In the low-k dielectric film 11 in the circuit region B, wiring 16 having a dual Damascene structure consisting of vias 16a and trench wiring 16b is formed. As the material for the wiring 16, a metal such as Cu (copper), W (tungsten), and Al (aluminum), or an alloy thereof is used.

In the same way as the first wiring layer, in the second wiring layer, an insulating film 25 is formed in a low-k dielectric film 21 of the pad region A, and a wiring 27 is formed in the insulating film 25. In the third wiring layer, an insulating film 35 is formed in a low-k dielectric film 31 of the pad region A, and pad vias 37 is formed in the insulating film 35. Further, in the fourth third wiring layer, an insulating film 45 is formed in a low-k dielectric film 41 of the pad region A, and a wiring 47 is formed in the insulating film 45.

A bonding pad 52 is formed on the highest wiring 47. A cover film 51 is formed on the bonding pad 52, low-k dielectric film 41, wiring 46 and insulating film 45. The bonding pad 52 is exposed through the opening formed in the cover film 51. As FIG. 2 shows, the bonding pad 52 is connected to the wire 61 during packaging of the semiconductor device.

Next, a method for manufacturing the above-described semiconductor device will be described.

Figure 3A:
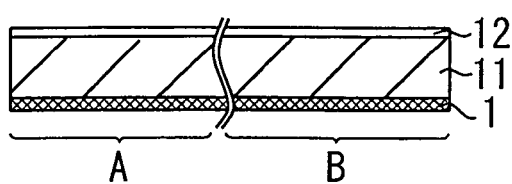
FIGS. 3A to 3F are sectional process views for illustrating a method for manufacturing a semiconductor device according to an embodiment of the present invention.
Figure 3B:
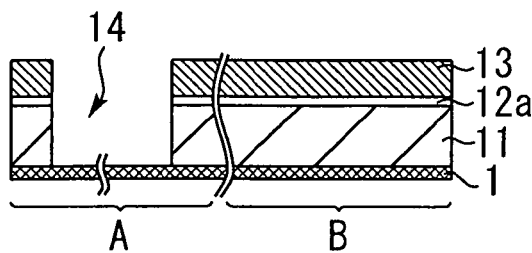
Figure 3C:
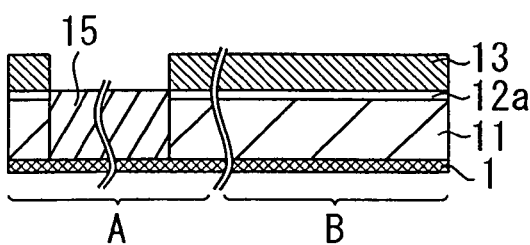
Figure 3D:
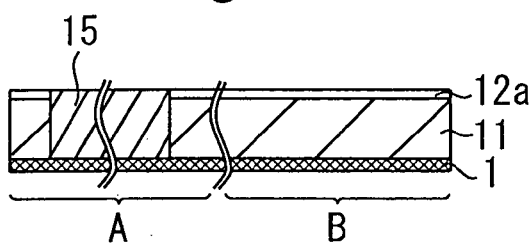
Figure 3E:
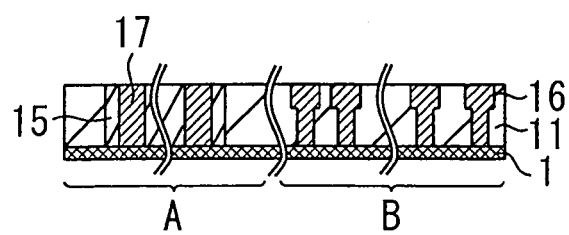
Figure 3F:
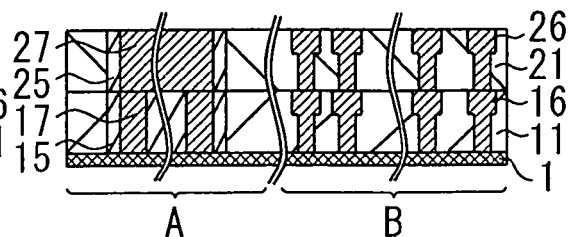
Figure 4:
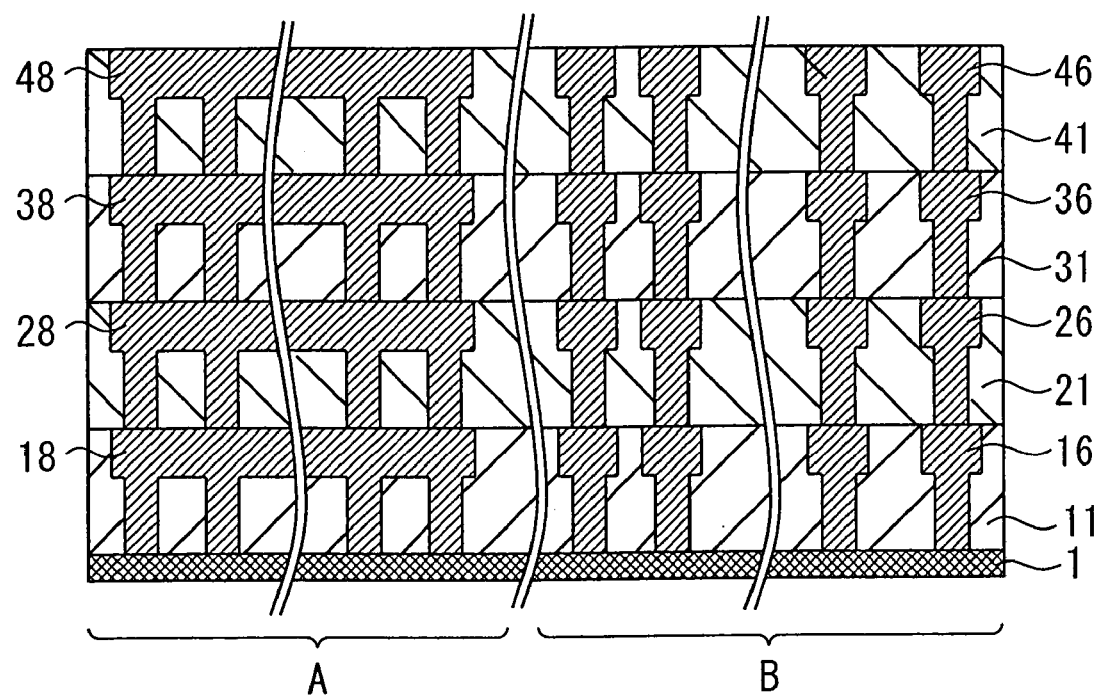
FIG. 4 is a schematic sectional view for illustrating a semiconductor device according to background art.

FIGS. 3A to 3F are sectional process views for illustrating a method for manufacturing a semiconductor device according to an embodiment of the present invention. Specifically, FIG. 3A is a diagram showing the state after a hard mask film is formed; FIG. 3B is a diagram showing the state after an opening is formed in the pad region; and FIG. 3C is a diagram showing the state after a silicon oxide film is formed in the opening. FIG. 3D is a diagram showing the state after the resist pattern is removed; FIG. 3E is a diagram showing the state after Damascene wiring and pad vias are formed; and FIG. 3F is a diagram showing the state after a second wiring layer is formed.

First, as FIG. 3A shows, a low-k dielectric film 11 is formed on a substrate 1 using a CVD (chemical vapor deposition) method or an SOD (spin on dielectric) method. Then, a hard mask film having a thickness of, for example, 10 nm to 150 nm is formed as a second insulation film 12 that will become a hard mask 12a, on the low-k dielectric film 11. Here, the hard mask film 12 is, for example, a silicon-based insulating film containing carbon and nitrogen.

Next, as FIG. 3B shows, a resist pattern 13 is formed on the hard mask 12 using a lithographic technique. Then, the hard mask film 12 and the low-k dielectric film 11 are sequentially patterned by dry etching using the resist pattern 13 as a mask. Thereby, a hard mask 12a is formed, and an opening 14 passing through the low-k dielectric film 11 is formed in the low-k dielectric film 11.

Next, as FIG. 3C shows, a silicon oxide film 15 is formed in the opening 14 using a liquid-phase deposition (LPD) method without removing the resist pattern 13. Although not shown in the drawing, the substrate 1 having the opening 14 is immersed in a treatment tank filled with a treating solution (e.g., a hydrosilicofluoric acid solution), and the equilibrium state is shifted by adding $H_3BO_3$ (boric acid) or the like, to form a silicon oxide film 15 having a desired thickness. Here, the silicon oxide film 15 is formed so that the surface of the silicon oxide film 15 is higher than the surface of the low-k dielectric film 11, and is lower than the surface of the resist pattern 13. The use of the liquid-phase deposition method facilitates the control of the thickness of the silicon oxide film 15. The formation of the silicon oxide film 15 is expressed by the following reaction formulas (1) and (2):

$$H_2SiF_6 + 2H_2O \rightarrow SiO_2 + 6HF \qquad (1)$$

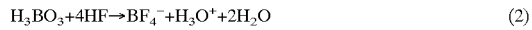

$$H_3BO_3 + 4HF \rightarrow BF_4^- + H_3O^+ + 2H_2O \qquad (2)$$

Next, as FIG. 3D shows, the resist pattern 13 is removed using ashing. In this time, since the low-k dielectric film 11 is coated with the hard mask 12a, the low-k dielectric film 11 is not damaged by plasma. Since the silicon oxide film 15 is formed using the above-described liquid-phase deposition method, the silicon oxide film 15 is not formed on the resist pattern 13; therefore, the step for removing the silicon oxide film 15 is not required separately before ashing.

Next, as FIG. 3E shows, wiring 16 consisting of vias 16a and trench wiring 16b is formed in the low-k dielectric film 11 of the circuit region B using a dual damascene process, and pad vias 17 are formed in the silicon oxide film 15 of the pad region A. In this time, the hard mask 12a on the low-k dielectric film 11 is also removed using CMP (chemical mechanical polish).

Thereafter, steps shown in FIGS. 3A to 3E are repeated to form a second wiring layer as shown in FIG. 3F. Then, the similar steps are repeated to form a third and fourth wiring layers, and a bonding pad 52 is formed on the wiring 47 of fourth wiring layer (highest wiring layer). A cover film 51, for example SiN film, is formed on the bonding pad 52, low-k dielectric film 41, wiring 46 and insulating film 45. Opening is formed in the cover film 51 so that the bonding pad 52 is exposed through the opening. Thus, the semiconductor device having multi-layer wiring layers shown in FIG. 1 is attained.

According to this embodiment, as described above, an opening 14 is formed in the low-k dielectric film 11 of the pad region A, a silicon oxide film 15 having strength higher than the strength of the low-k dielectric film 11 is formed in the opening 14, and wirings (pad vias) 17 are formed in the silicon oxide film 15. In the pad region A of the semiconductor device, the sidewalls of the pad vias 17 are surrounded (covered) not by the low-k dielectric film 11, but by the silicon oxide film 5 having the strength higher than the strength of the low-k dielectric film 11. Therefore, the strength of the pad region A of the semiconductor device is dramatically improved. Thus, a semiconductor device having a high resistance to impact occurring during packaging, and a method for manufacturing such a semiconductor device, can be obtained.

This invention, when practiced illustratively in the manner described above, provides the following major effects:

According to the present invention, a semiconductor device having a high resistance to impact occurring during packaging, and a method for manufacturing such a semiconductor device, can be provided.

Further, the present invention is not limited to these embodiments, but variations and modifications may be made without departing from the scope of the present invention.

The entire disclosure of Japanese Patent Application No. 2003-087805 filed on Mar. 27, 2003 containing specification, claims, drawings and summary are incorporated herein by reference in its entirety.

What is claimed is:

1. A semiconductor device having a pad region and a circuit region, comprising:
   a low-k dielectric film on the pad region and the circuit region of a substrate, the low-k dielectric film having a dielectric constant of no more than 3;
   an insulating film interposed in the low-k dielectric film of the pad region, the insulating film having higher strength than the low-k dielectric film;
   multi-layer wirings interposed in the insulating film of the pad region and interposed in the low-k dielectric film of the circuit region; and
   a bonding pad on an outermost wiring of the multi-layer wirings of the pad region.

2. The semiconductor device according to claim 1, wherein sidewalls of the wirings in the pad region are surrounded by the insulating film.

3. The semiconductor device according to claim 1, wherein the low-k dielectric film is an insulating film containing silicon, carbon, oxygen, and hydrogen.

4. The semiconductor device according to claim 1, wherein the low-k dielectric film is a polymer film containing hydrogen and carbon.

5. The semiconductor device according to claim 1, wherein sidewalls of the wirings in the pad region are in contact with the insulating film.

6. A semiconductor device having a pad region and a circuit region, comprising:

multi-layer low-k dielectric films on the pad region and the circuit region of a substrate, each of the multi-layer low-k dielectric films having a dielectric constant of no more than 3;

insulating films formed in each of the multi-layer low-k dielectric films of the pad region, each of the insulating films having higher strength than each of the multi-layer low-k dielectric films;

wirings formed in each of the insulating films of the pad region and in each of the low-k dielectric films of the circuit region; and a bonding pad on an outermost wiring of the wirings of the pad region.

7. The semiconductor device according to claim 6, wherein sidewalls of the wirings in the pad region are surrounded by the insulating films.

* * * * *

UNITED STATES PATENT AND TRADEMARK OFFICE
CERTIFICATE OF CORRECTION

| | | |
|---|---|---|
| PATENT NO. | : 7,015,589 B2 | Page 1 of 1 |
| APPLICATION NO. | : 10/806341 | |
| DATED | : March 21, 2006 | |
| INVENTOR(S) | : Shin | |

It is certified that error appears in the above-identified patent and that said Letters Patent is hereby corrected as shown below:

On the Title page item 56, under References Cited, please replace "Chenet al." with --Chen et al.--

Column 4, line 30, please replace "oxide film 5" with --oxide film 15--

Signed and Sealed this

Twentieth Day of February, 2007

JON W. DUDAS
*Director of the United States Patent and Trademark Office*